US009293376B2

(12) United States Patent
Su et al.

(10) Patent No.: US 9,293,376 B2
(45) Date of Patent: Mar. 22, 2016

(54) APPARATUS AND METHOD FOR POWER MOS TRANSISTOR

(75) Inventors: Po-Chih Su, New Taipei (TW);
Hsueh-Liang Chou, Jhubei (TW);
Chun-Wai Ng, Hsin-Chu (TW);
Ruey-Hsin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 60 days.

(21) Appl. No.: 13/546,824

(22) Filed: Jul. 11, 2012

(65) Prior Publication Data

US 2014/0015045 A1 Jan. 16, 2014

(51) Int. Cl.
| | |
|---|---|
| *H01L 29/66* | (2006.01) |
| *H01L 21/8234* | (2006.01) |
| *H01L 29/40* | (2006.01) |
| *H01L 29/423* | (2006.01) |
| *H01L 29/78* | (2006.01) |
| *H01L 21/265* | (2006.01) |
| *H01L 21/28* | (2006.01) |
| *H01L 29/08* | (2006.01) |

(52) U.S. Cl.
CPC *H01L 21/823456* (2013.01); *H01L 21/823462* (2013.01); *H01L 21/823487* (2013.01); *H01L 21/823493* (2013.01); *H01L 29/407* (2013.01); *H01L 29/4236* (2013.01); *H01L 29/66734* (2013.01); *H01L 29/781* (2013.01); *H01L 21/26586* (2013.01); *H01L 21/2815* (2013.01); *H01L 29/0886* (2013.01); *H01L 29/42376* (2013.01); *H01L 29/7816* (2013.01); *H01L 29/7835* (2013.01)

(58) Field of Classification Search
CPC .............. H01L 29/66674; H01L 29/7827; H01L 27/0727; H01L 27/0629; H01L 21/2815; H01L 29/0696; H01L 29/1095; H01L 29/7813
USPC .................................. 257/331–338; 438/243
See application file for complete search history.

(56) References Cited

U.S. PATENT DOCUMENTS

| | | | | |
|---|---|---|---|---|
| 5,242,845 | A * | 9/1993 | Baba et al. ..................... | 438/243 |
| 6,545,315 | B2 * | 4/2003 | Hshieh et al. ................. | 257/328 |
| 6,838,730 | B1 * | 1/2005 | Kawaguchi et al. ........... | 257/331 |
| 2004/0256666 | A1 * | 12/2004 | Fujishima et al. ............. | 257/329 |
| 2005/0167742 | A1 * | 8/2005 | Challa et al. .................. | 257/328 |
| 2008/0191273 | A1 * | 8/2008 | Henson et al. ................ | 257/331 |
| 2009/0053869 | A1 * | 2/2009 | Hirler ................ | H01L 21/2815 438/270 |
| 2010/0213505 | A1 * | 8/2010 | Hirler ................ | H01L 27/0727 257/139 |
| 2010/0330398 | A1 * | 12/2010 | Kitamura ............ | H01L 27/0629 429/7 |
| 2013/0240984 | A1 * | 9/2013 | Cheng .................. | H01L 29/407 257/330 |

* cited by examiner

*Primary Examiner* — Jerome Jackson, Jr.
*Assistant Examiner* — Fan-Xing Jiang
(74) *Attorney, Agent, or Firm* — Slater & Matsil, L.L.P.

(57) ABSTRACT

A power MOS transistor comprises a drain contact plug formed over a first side of a substrate, a source contact plug formed over a second side of the substrate and a trench formed between the first drain/source region and the second drain/source region. The trench comprises a first gate electrode, a second gate electrode, wherein top surfaces of the first gate electrode and the second gate electrode are aligned with a bottom surface of drain region. The trench further comprises a field plate formed between the first gate electrode and the second gate electrode, wherein the field plate is electrically coupled to the source region.

17 Claims, 22 Drawing Sheets

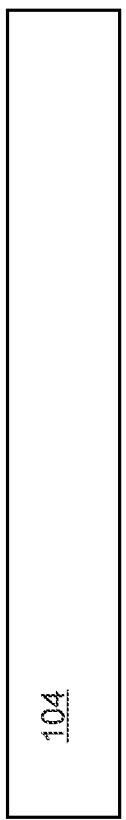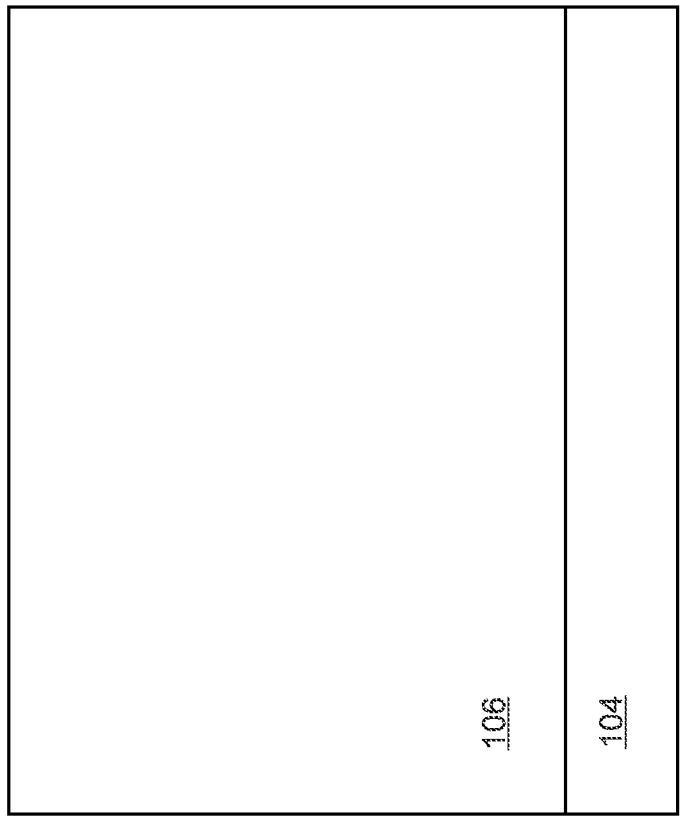

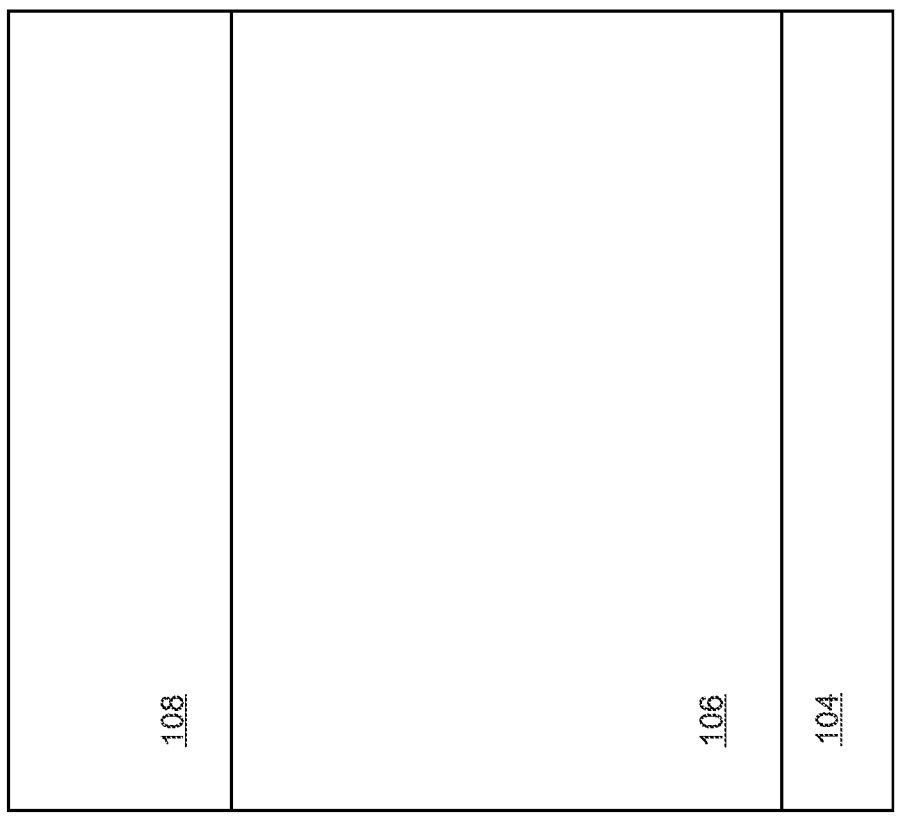

APPARATUS AND METHOD FOR POWER MOS TRANSISTOR

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are needed to maintain the electronic components' performance from one generation to the next. For example, low on resistance, low gate charge and high breakdown voltage power transistors are desirable for high power applications.

As semiconductor technologies evolve, metal oxide semiconductor (MOS) transistors have been widely used in today's integrated circuits. MOS transistors are voltage controlled device. When a control voltage is applied to the gate a MOS transistor and the control voltage is greater than the threshold of the MOS transistor, a conductive channel is established between the drain and the source of the MOS transistor. As a result, a current flows between the drain and the source of the MOS transistor. On the other hand, when the control voltage applied to the gate of the MOS transistor is less than the threshold of the MOS transistor, the MOS transistor is turned off accordingly.

MOS transistors may include two major categories. One is n-channel MOS transistors; the other is p-channel MOS transistors. According to the structure difference, MOS transistors can be further divided into two sub-categories, planar MOS transistors and vertical MOS transistors.

Vertical power MOS transistors have widely used in high voltage and current applications due to their low gate drive power, fast switching speed and lower on resistance. In a vertical power MOSFET, the drain and source are placed on opposite sides of a wafer. There may be a trench structure formed between the drain and the source of the vertical power MOS transistors.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 3 illustrates a cross sectional view of a substrate in accordance with an embodiment;

FIG. 4 illustrates a cross sectional view of the semiconductor device shown in FIG. 3 after an epitaxial layer is grown from the substrate in accordance with an embodiment;

FIG. 5 illustrates a cross sectional view of the semiconductor device shown in FIG. 4 after another epitaxial layer is grown from the p-type epitaxial layer in accordance with an embodiment;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a bottom-source Power Metal-Oxide-Semiconductor Field-Effect Transistors (MOSFETs). The embodiments of the disclosure may also be applied, however, to a variety of high voltage transistors. The embodiments of the disclosure may also be applied, however, to a variety of structures of semiconductor devices. Hereinafter, various embodiments will be explained in detail with reference to the accompanying drawings.

Figure 1:
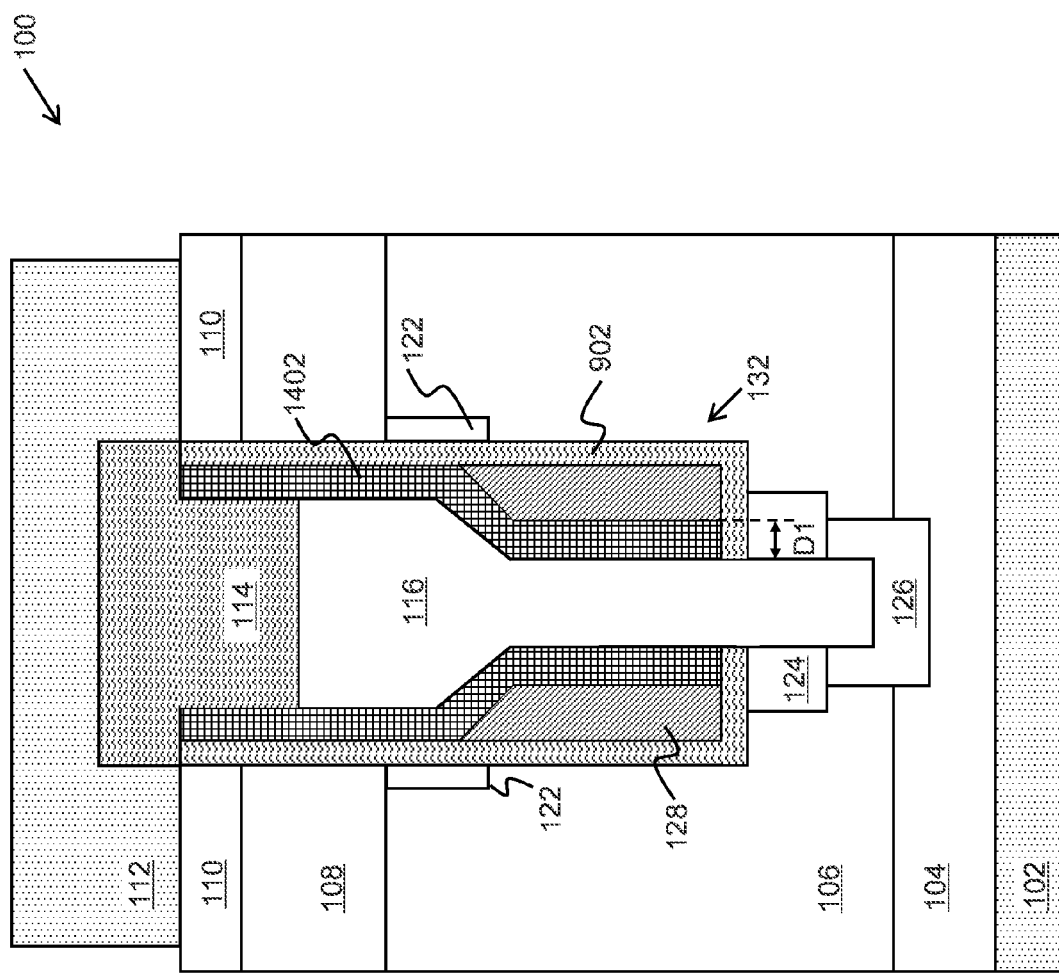
FIG. 1 is a cross sectional view of a bottom-source trench power MOSFET in accordance with an embodiment.

FIG. 1 is a cross sectional view of a bottom-source trench power MOSFET in accordance with an embodiment. As shown in FIG. 1, a source contact plug 102 and a drain contact plug 112 of the bottom-source trench power MOSFET 100 are fabricated on opposite side of a wafer. In particular, the source contact plug 102 is formed underneath a p+ substrate 104. The drain contact plug 112 is formed over the p+ substrate 104. The bottom-source trench power MOSFET 100 further comprises a p-type epitaxial layer 106 grown from the p+ substrate 104. An n+ source region 124 is formed in the p-type epitaxial layer 106. An n+ drain region 110 is formed underneath the drain contact plug 112. An n-type epitaxial layer 108 is formed between the n+ drain region 110 and the p-type epitaxial layer 106.

As shown in FIG. 1, there may be a trench 132 formed between the n+ source region 124 and the drain contact plug 112. The trench comprises a field plate 116, an oxide film 114, a first gate dielectric layer 902, a second gate dielectric layer 1402 and two gate regions 128. The gate regions 128 are formed at the bottom half of the trench 132. The field plate 116 is formed between two gate regions 128 and electrically coupled to the source contact plug 102 through a p+ region 126 and the p+ substrate 104.

In comparison with conventional trench MOS transistors, which have a single gate region in a gate trench, the bottom-source trench power MOSFET 100 has a relatively small gate region by splitting the gate region into two smaller gate regions as shown in FIG. 1. In addition, the field plate 116 is employed to fill the opening between the gate regions shown in FIG. 1. By reducing the area of the gate region, the gate charge of the bottom-source trench power MOSFET 100 is reduced accordingly. In short, one advantageous feature of having the field plate 116 coupled to the source contact plug 102 is that the gate charge capacitance is improved. As a result, the switching losses of the bottom-source trench power MOSFET 100 may be reduced.

The oxide film 114, the first gate dielectric layer 902 and the second gate dielectric layer 1402 fill the free space of the trench 132 so that the gate regions 128, the field plate 116 and the drain contact plug 112 are insulated to each other. In accordance with an embodiment, the second gate dielectric layer 1402 functions as an insulating film between the field plate 116 and the gate regions 128. The second gate dielectric layer 1402 is of a thickness of D1, which is in a range from about 0.1 um to about 0.5 um.

The bottom-source trench power MOSFET 100 may comprise two n-type drain-drift (NDD) regions formed along the outer periphery of the trench. The NDD regions 122 are symmetrical relative to the trench. The NDD regions 122 are an extension of the drain and electrically coupled to the drain contact plug 112.

In accordance with an embodiment, the drain region of the bottom-source trench power MOSFET 100 is formed by the n+ drain region 110, the n-type epitaxial layer 108 and the NDD regions 122. In order to connect the drain region with external circuits (not shown), the drain region is coupled to the drain contact plug 112. In order to reduce the gate-to-drain capacitance, the NDD regions 122 may be formed as are aligned with the gate regions 128. In particular, in a NDD ion implantation process, the gate regions 128 are used as ion implantation masks to prevent the ions of the NDD regions from entering the regions below the upper regions of the gate regions 128. As a result, the lower portions of the NDD regions 122 are horizontally aligned with the upper portions of the gate regions 128.

Figure 2:
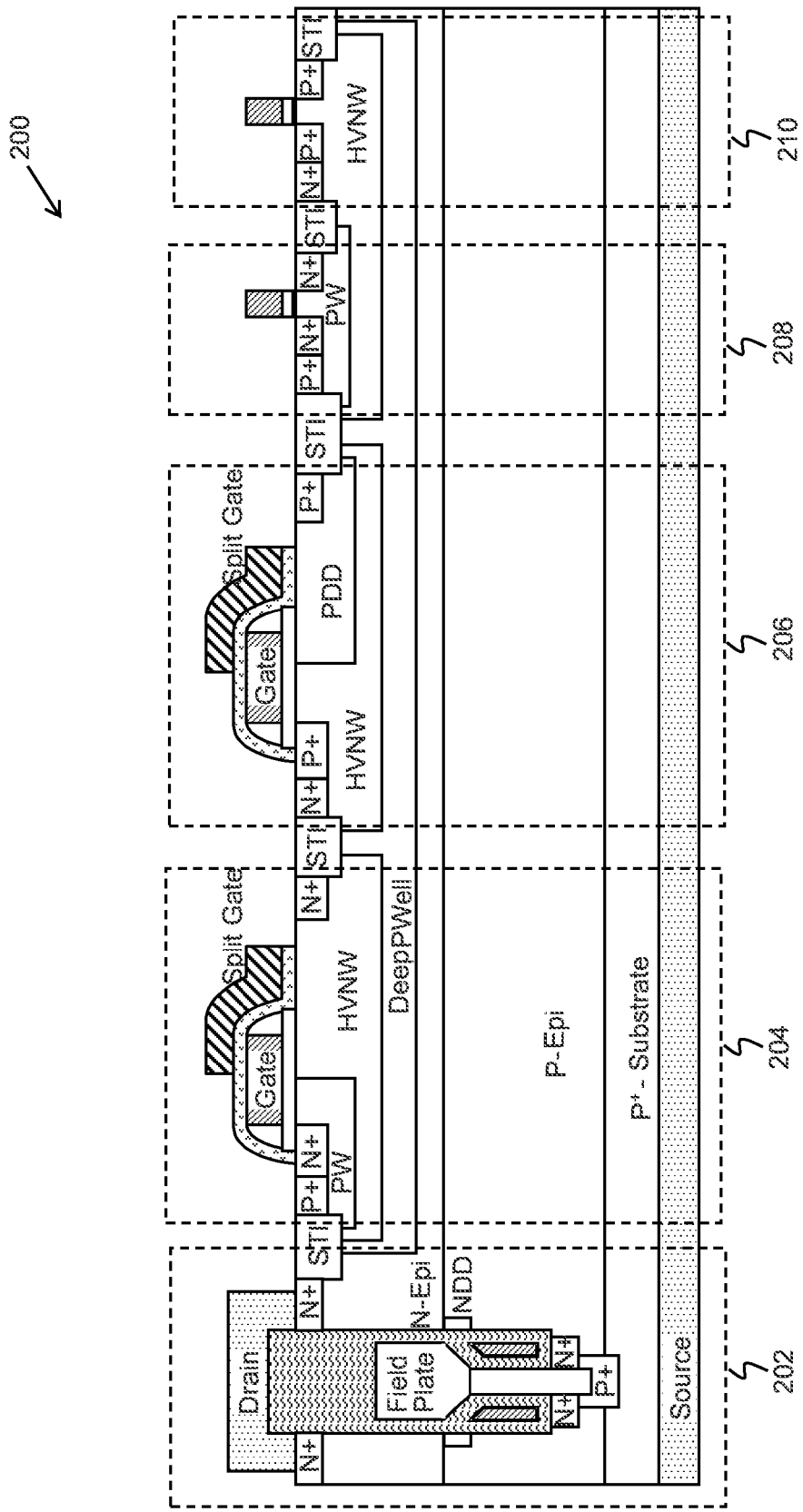
FIG. 2 illustrates a cross sectional view of a semiconductor device comprising a bottom-source trench power MOSFET in accordance with an embodiment.

FIG. 2 illustrates a cross sectional view of a semiconductor device comprising a bottom-source trench power MOSFET in accordance with an embodiment. The semiconductor device 200 includes four regions, namely a first region 202 for forming a bottom-source trench power MOSFET device, a second region 204 for forming a planar NMOS device, a third region 206 for forming a planar PMOS device, a fourth region 208 for forming a low voltage NMOS device and a fifth region 210 for forming a low voltage PMOS device. Each of the regions 202, 204, 206, 208 and 210 are defined by insulation regions such as shallow trench isolation (STI) regions. Alternatively, field oxides can be formed as insulation regions.

As shown in FIG. 2, in order to integrate the bottom-source trench power MOSFET device with the lateral MOS devices (e.g., a planar NMOS device), a deep p-type well as shown in FIG. 2 is employed to isolate the lateral MOS devices from the bottom-source trench power MOSFET device. One advantageous feature of having the bottom-source trench power MOSFET 100 shown in FIG. 1 is that the bottom-source trench power MOSFET structure can be integrated with lateral MOS devices. As such, the existing lateral device fabrication process may be reused. The existing lateral device fabrication process helps to reduce the cost of fabricating the bottom-source trench power MOSFET.

FIGS. 3-22 illustrate intermediate steps of fabricating the bottom-source trench power MOSFET 100 shown in FIG. 1 in accordance with an embodiment. FIG. 3 illustrates a cross sectional view of a substrate 104 in accordance with an embodiment. The substrate 104 may be formed of silicon, silicon germanium, silicon carbide or the like. In accordance with an embodiment, the substrate 104 may be a p+ substrate, which is doped with a p-type impurity such as boron, indium or the like. The substrate 104 is of a doping density in a range from about $10^{18}/cm^3$ to about $10^{21}/cm^3$.

FIG. 4 illustrates a cross sectional view of the semiconductor device shown in FIG. 3 after an epitaxial layer is grown from the p-type substrate 104 in accordance with an embodiment. The p-type epitaxial layer 106 is grown from the p-type substrate 104. The epitaxial growth of the p-type epitaxial layer 106 may be implemented by using suitable semiconductor fabrication processes such as chemical vapor deposition (CVD), ultra-high vacuum chemical vapor deposition (UHV-CVD) and the like. In accordance with an embodiment, the p-type epitaxial layer 106 is of a doping density in a range from about $10^{14}/cm^3$ to about $10^{16}/cm^3$.

FIG. 5 illustrates a cross sectional view of the semiconductor device shown in FIG. 4 after another epitaxial layer is grown from the p-type epitaxial layer in accordance with an embodiment. The n-type epitaxial layer 108 is grown from the p-type epitaxial layer 106. The epitaxial growth of the n-type epitaxial layer 108 may be implemented by using suitable fabrication processes such as CVD, UHV-CVD and the like.

In accordance with an embodiment, the n-type epitaxial layer 108 is of a doping density in a range from about $10^{14}/cm^3$ to about $10^{16}/cm^3$.

Figure 6:
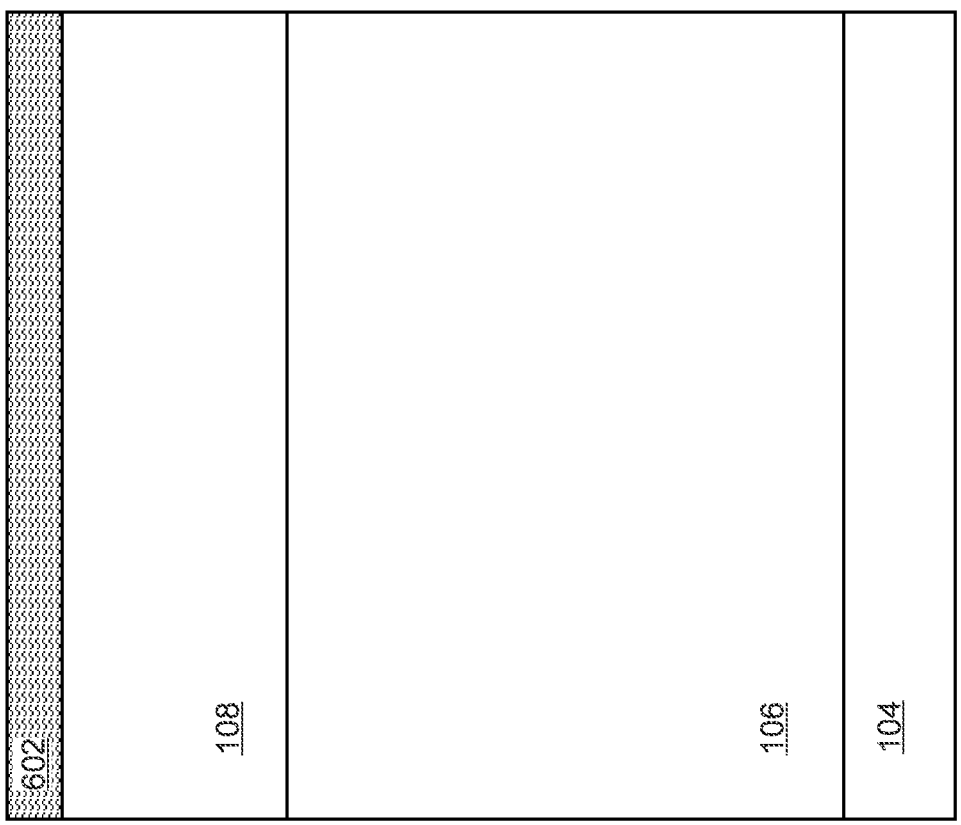
FIG. 6 illustrates a cross sectional view of the semiconductor device shown in FIG. 5 after a dielectric layer is deposited on the semiconductor device in accordance with an embodiment.

FIG. 6 illustrates a cross sectional view of the semiconductor device shown in FIG. 5 after a dielectric layer is deposited on the semiconductor device in accordance with an embodiment. The dielectric layer 602 may comprise an oxide layer. The dielectric layer 602 may be formed by any oxidation process, such as wet or dry thermal oxidation in an ambient environment comprising an oxide, $H_2O$, NO, or a combination thereof, or by CVD techniques using tetra-ethyl-orthosilicate (TEOS) and oxygen as a precursor.

Figure 7:
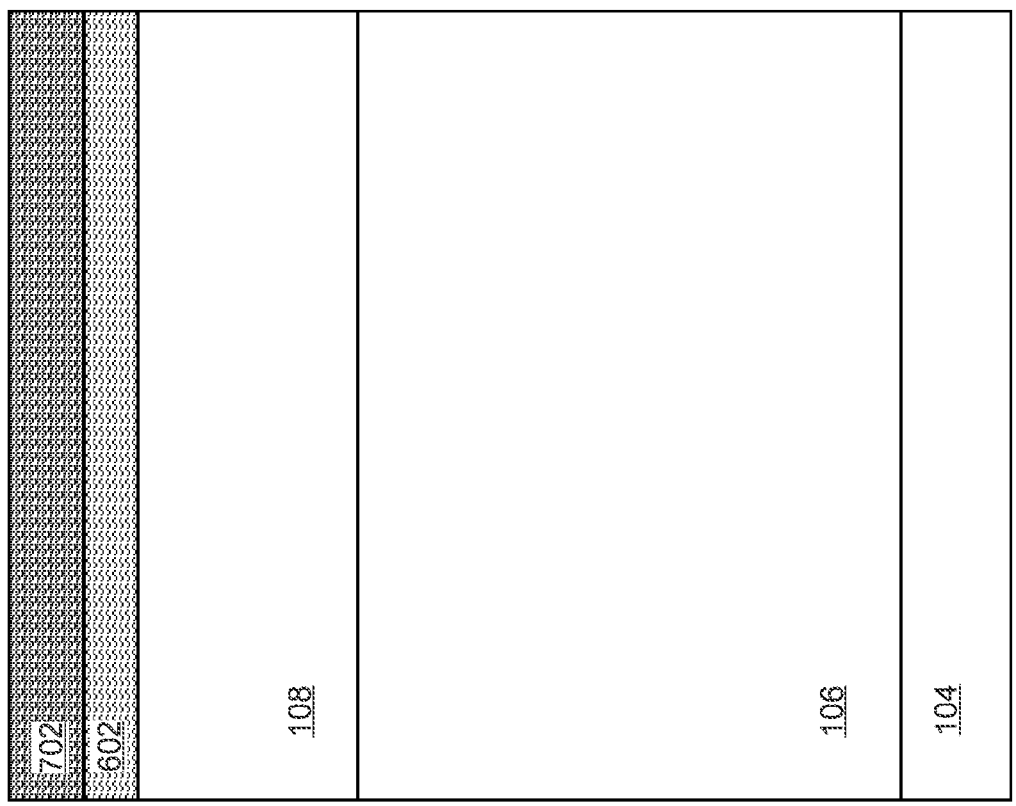
FIG. 7 illustrates a cross sectional view of the semiconductor device shown in FIG. 6 after a hard mask layer is deposited on the dielectric layer in accordance with an embodiment.

FIG. 7 illustrates a cross sectional view of the semiconductor device shown in FIG. 6 after a hard mask layer is deposited on the dielectric layer in accordance with an embodiment. The hard mask layer 702 functions as an etching mask. The hard mask layer 702 may be formed of suitable materials such as silicon nitride. Throughout the description, the hard mask layer 702 may be alternatively referred to as a nitride layer 702. The nitride layer 702 is deposited on top of the dielectric layer 602 through suitable fabrication techniques such as CVD and the like.

Figure 8:
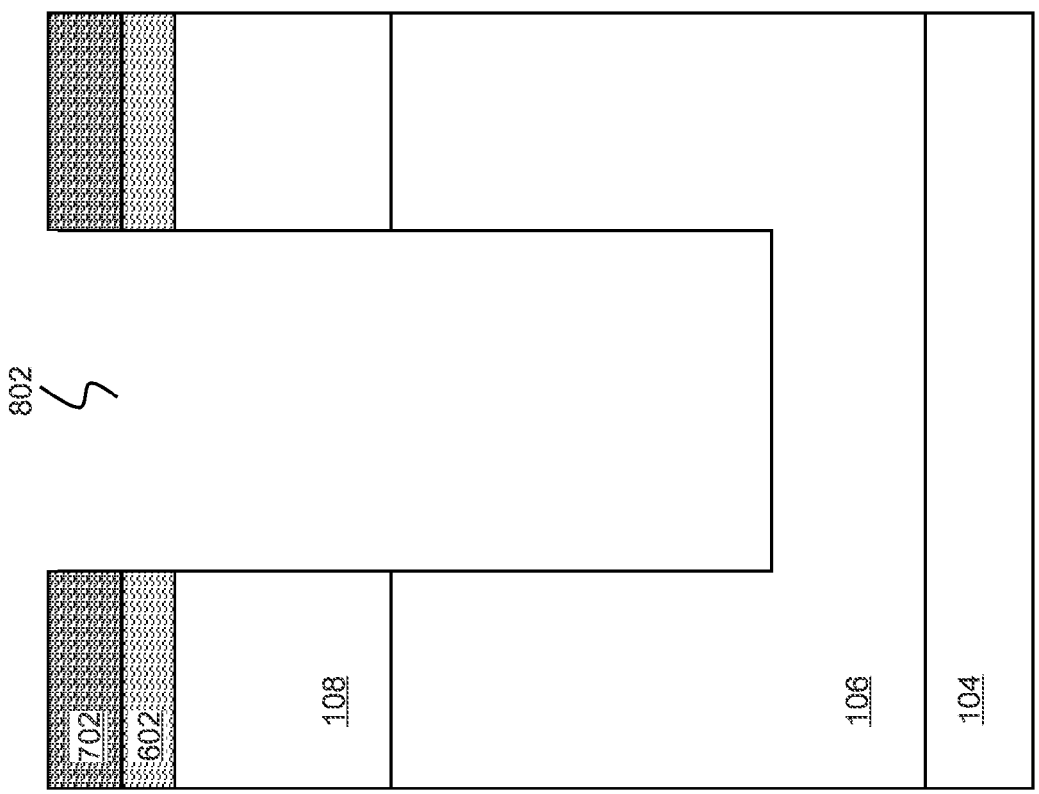
FIG. 8 illustrates a cross sectional view of the semiconductor device shown in FIG. 7 after a first trench is formed in the epitaxial layers in accordance with an embodiment.

FIG. 8 illustrates a cross sectional view of the semiconductor device shown in FIG. 7 after a first trench is formed in the epitaxial layers in accordance with an embodiment. The nitride layer 702 is patterned in consideration with the location of the trench 132 of the bottom-source trench power MOSFET 100 (shown in FIG. 1). Thereafter, an etching process, such as a reactive ion etch (RIE) or other dry etch, an anisotropic wet etch, or any other suitable anisotropic etch or patterning process, is performed to form the trench 802. The epitaxial layers including the n-type epitaxial 108 and the p-type epitaxial layer 106 are etched to from the first trench 802. As shown in FIG. 8, the etching process may etch through the n-type epitaxial layer 108 and partially etch the p-type epitaxial layer 106 to form the first trench 802.

Figure 9:
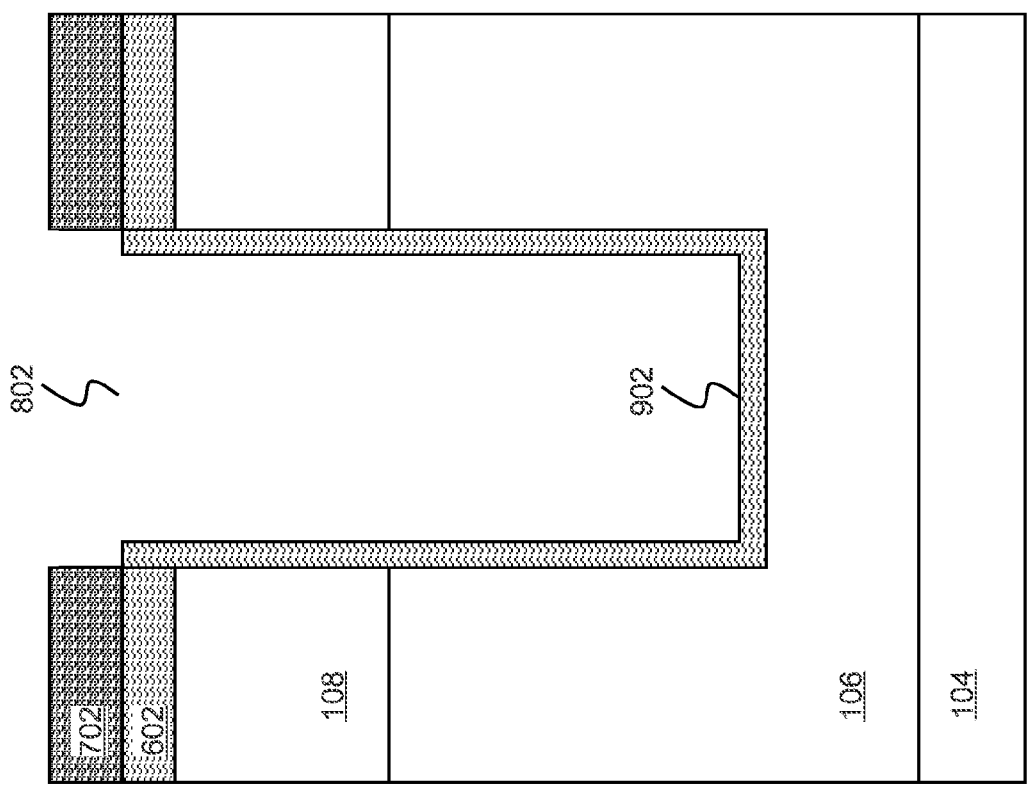
FIG. 9 illustrates a cross sectional view of the semiconductor device shown in FIG. 8 after a first gate dielectric layer is formed in the trench in accordance with an embodiment.

FIG. 9 illustrates a cross sectional view of the semiconductor device shown in FIG. 8 after a first gate dielectric layer is formed in the trench in accordance with an embodiment. As shown in FIG. 9, the first gate dielectric layer 902 is formed on the bottom of the first trench 802 as well as the sidewalls of the first trench 802. The first gate dielectric layer 902 may be formed of commonly used dielectric materials such as oxides, nitrides, oxynitrides, high-k materials, combinations thereof, and multi-layers thereof. In accordance with an embodiment, the first gate dielectric layer 902 is an oxide layer. The first gate dielectric layer 902 may be formed by using suitable thermal treatment techniques, wet treatment techniques or deposition techniques such as PVD, CVD, ALD or the like.

Figure 10:
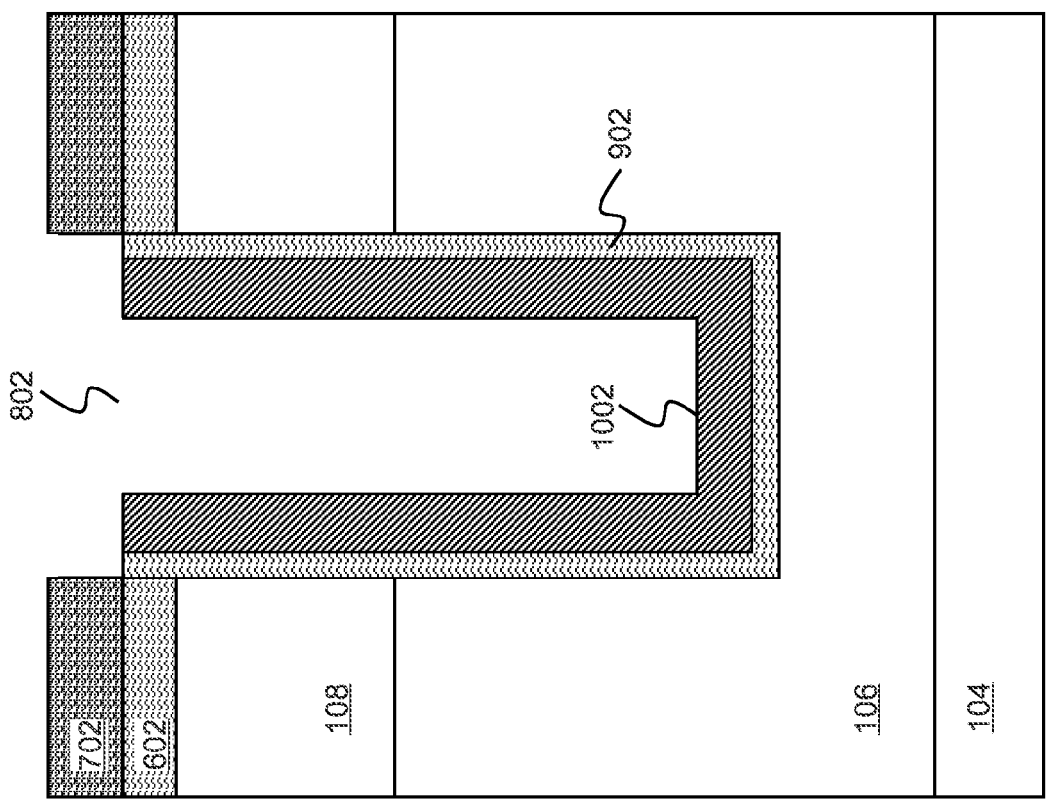
FIG. 10 illustrates a cross sectional view of the semiconductor device shown in FIG. 9 after a gate electrode layer is formed in the trench in accordance with an embodiment.

FIG. 10 illustrates a cross sectional view of the semiconductor device shown in FIG. 9 after a gate electrode layer is formed in the trench in accordance with an embodiment. The gate electrode layer 1002 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon).

In accordance with an embodiment, the gate electrode layer 1002 is formed of poly-silicon. The gate electrode layer 1002 may be formed by depositing doped or undoped poly-silicon by low-pressure chemical vapor deposition (LPCVD). In accordance with another embodiment, the gate electrode layer 1002 is formed of metal materials such as titanium nitride, tantalum nitride, tungsten nitride, titanium, tantalum and/or combinations. The metal gate electrode layer may be is formed on the first gate dielectric layer 902 using suitable deposition techniques such as ALD, CVD, PVD and the like. The above deposition techniques are well known in the art, and hence are not discussed herein.

Figure 11:
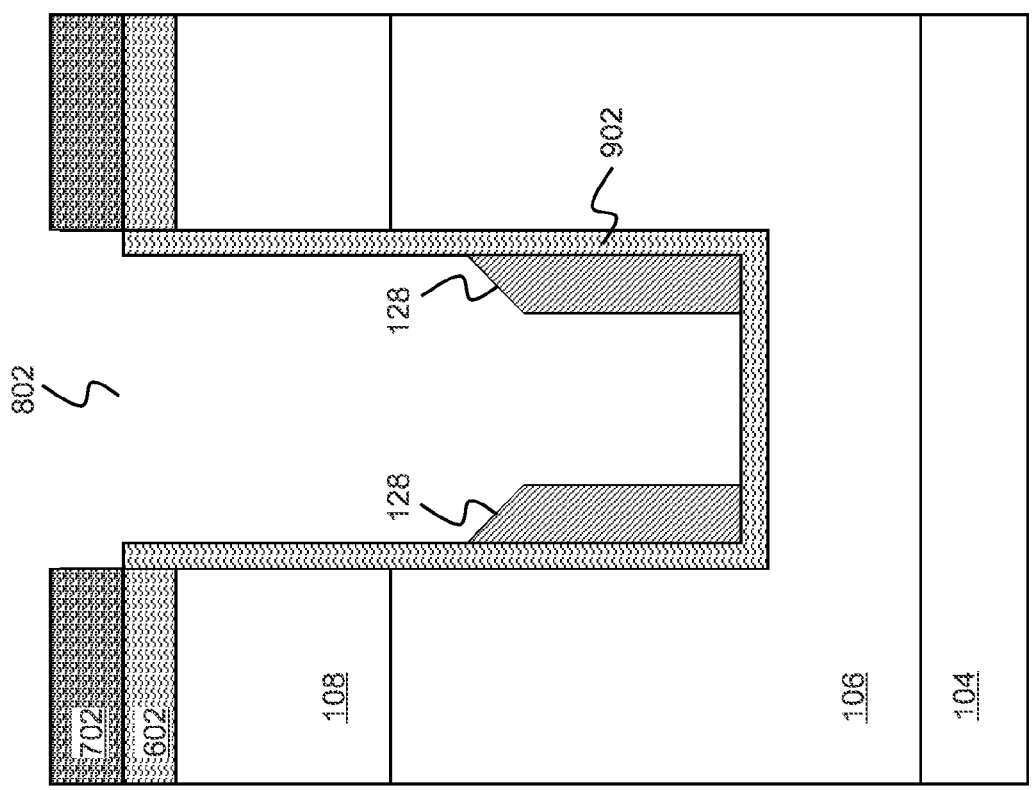
FIG. 11 illustrates a cross sectional view of the semiconductor device shown in FIG. 10 after an etching process is applied to the gate electrode layer in accordance with an embodiment.

FIG. 11 illustrates a cross sectional view of the semiconductor device shown in FIG. 10 after an etching process is applied to the gate electrode layer in accordance with an embodiment. An etching process may be performed to remove unwanted portions of the gate electrode layer to form the gate electrodes 128 as illustrated in FIG. 11. In accordance with an embodiment, the gate electrode material is poly-crystalline silicon. The etching process may be a wet or dry, anisotropic or isotropic, etch process, but preferably is an anisotropic dry etch process. As shown in FIG. 11, the top surface of the gate electrode 128 is lower than the bottom surface of the n-type epitaxial layer 108.

Figure 12:
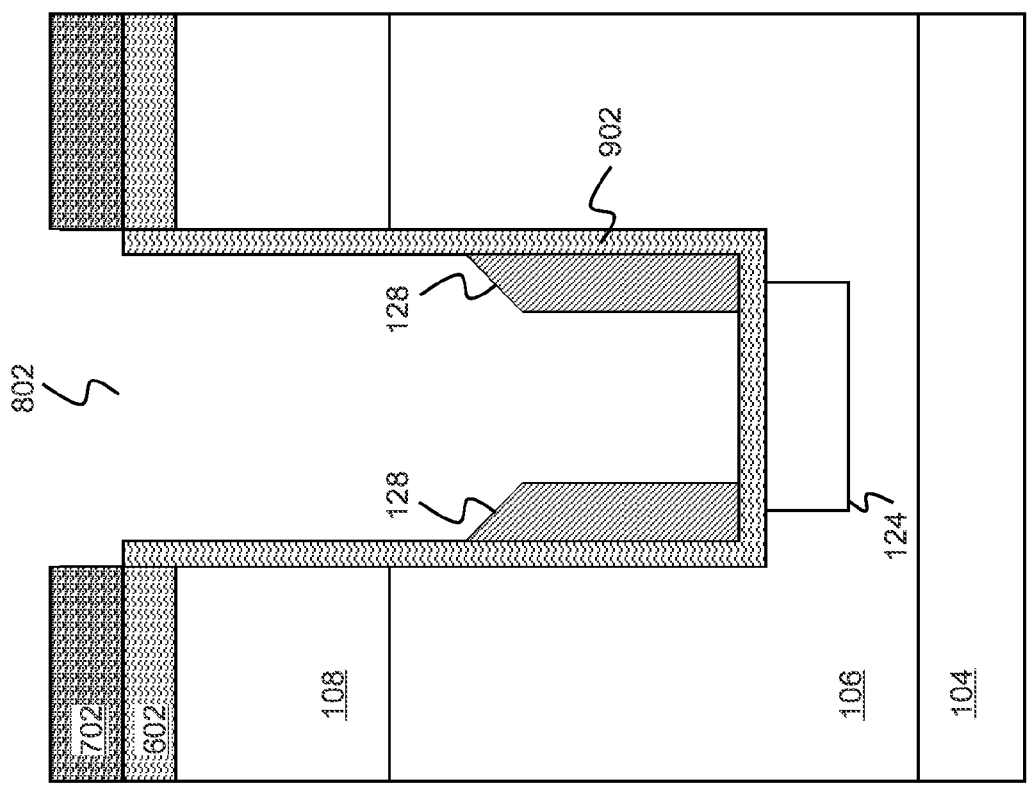
FIG. 12 illustrates a cross sectional view of the semiconductor device shown in FIG. 11 after an n+ region is formed in accordance with an embodiment.

FIG. 12 illustrates a cross sectional view of the semiconductor device shown in FIG. 11 after an n+ region is formed in the p-type epitaxial layer in accordance with an embodiment. As shown in FIG. 12, the n+ region 124 is formed through suitable fabrication processes such as an ion implantation process. In accordance with an embodiment, the n+ region 124 may function as a source region of the bottom-source trench power MOSFET 100 shown in FIG. 1.

In an embodiment in which the substrate 104 is a p-type substrate, the source region 124 may be formed by implanting appropriate n-type dopants such as phosphorous, arsenic, or the like. Alternatively, in an embodiment in which the substrate 104 is an n-type substrate, the source region 124 may be formed by implanting appropriate p-type dopants such as boron, gallium, indium, or the like. In accordance with an embodiment, the source region 124 is of a doping density in a range from about $10^{19}/cm^3$ to about $10^{21}/cm^3$.

Figure 13:
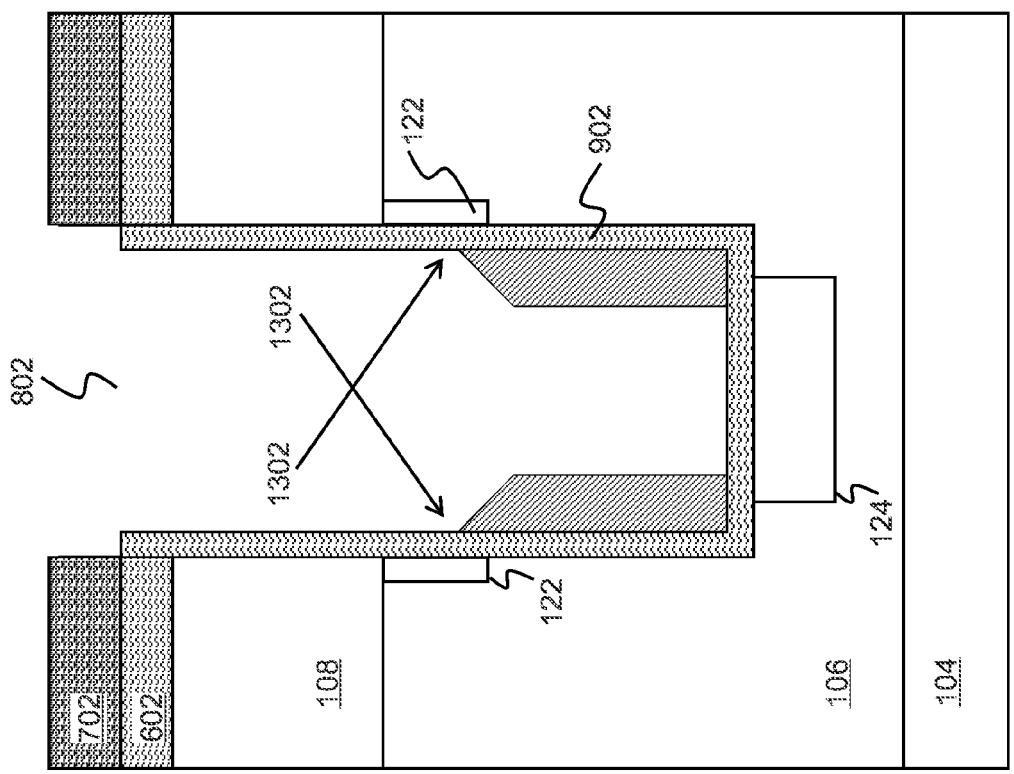
FIG. 13 illustrates a cross sectional view of the semiconductor device shown in FIG. 12 after two n-type drain-drift regions are formed in accordance with an embodiment.

FIG. 13 illustrates a cross sectional view of the semiconductor device shown in FIG. 12 after two n-type drain-drift regions is formed in accordance with an embodiment. As shown in FIG. 13, the n-type drain-drift regions 122 may be formed through suitable fabrication processes such as a tilted angle ion implantation process. In accordance with an embodiment, the n-type drain-drift regions 122 may be formed by implanting appropriate n-type dopants such as phosphorous. It should further be noted that other n-type dopants such as arsenic, nitrogen, antimony, combination thereof, or the like, could alternatively be used. In accordance with an embodiment, the n-type drain-drift regions 122 are of a doping density in a range from about $10^{15}/cm^3$ to about $10^{18}/cm^3$.

As shown in FIG. 13, the arrows 1302 represent the directions of the tilted angle ion implantation process. By controlling the ion implantation's directions as shown by arrows 1302 in FIG. 13, the gate regions 128 may function as ion plantation masks. As a result, the gate regions 128 prevent ions from entering the regions below the upper portions of the gate regions 128. As shown in FIG. 13, after the ion implantation process is applied, the bottom portions of the n-type drain-drift regions 122 are approximately aligned with the upper portions of the gate electrodes 128.

One advantageous feature of having such an alignment between the n-type drain-drift regions 122 and the gate electrodes 128 is that the gate-to-drain capacitance of the bottom-source trench power MOSFET 100 may be reduced accordingly. Such a reduced gate-to-drain capacitance helps to further improve the switching losses of the bottom-source trench power MOSFET 100.

Figure 14:
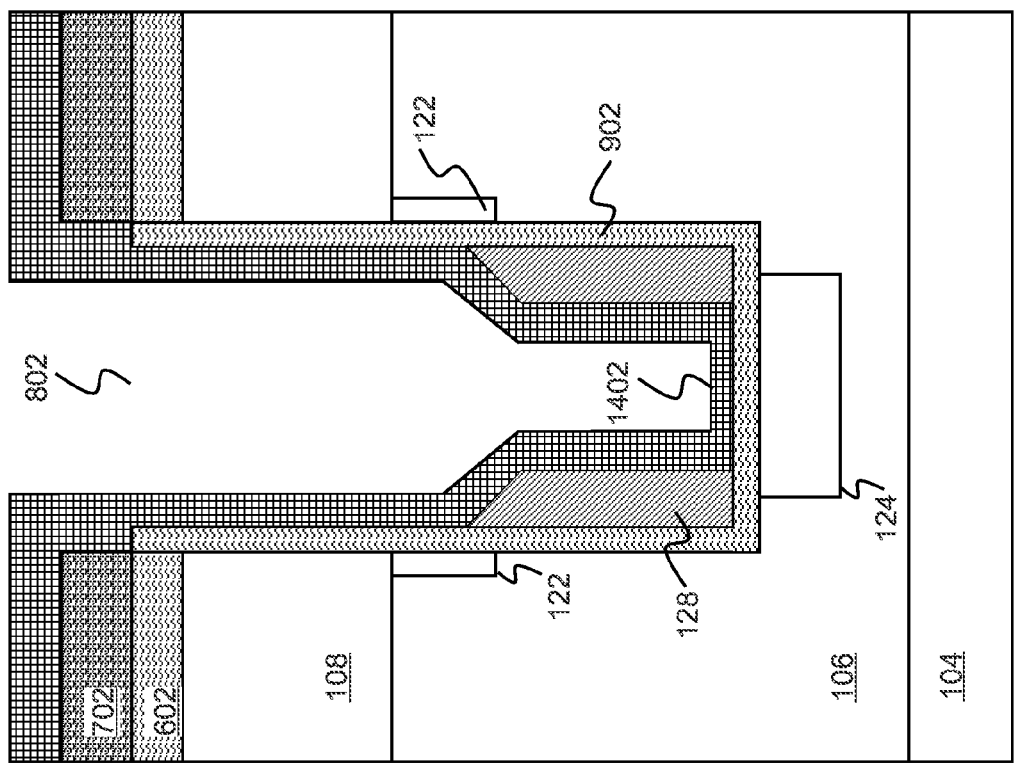
FIG. 14 illustrates a cross sectional view of the semiconductor device shown in FIG. 13 after an oxide layer is deposited in the trench and the surface of the semiconductor device in accordance with an embodiment.

FIG. 14 illustrates a cross sectional view of the semiconductor device shown in FIG. 13 after a second gate dielectric layer is deposited in the trench and the surface of the semiconductor device in accordance with an embodiment. The second gate dielectric layer 1402 may be of oxide. The second gate dielectric layer 1402 may be formed by any suitable oxidation processes such as wet or dry thermal oxidation process, CVD or the like. In accordance with an embodiment, the oxidation process is so controlled that the thickness of the second gate dielectric layer 1402 is in a range from about 0.1 um to about 0.5 um.

Figure 15:
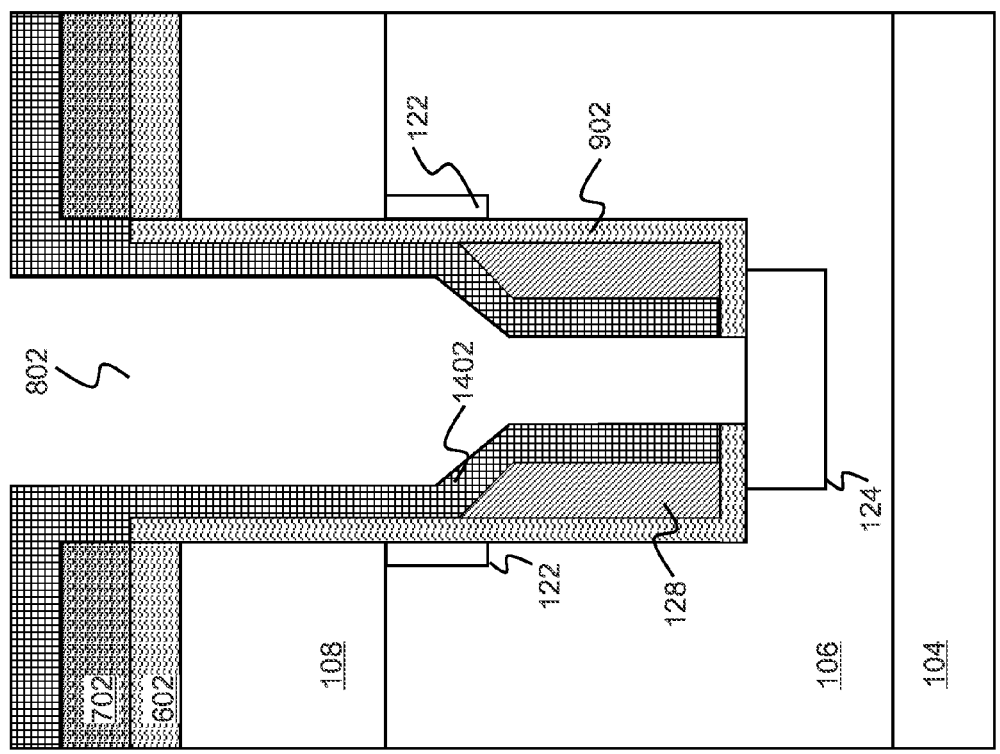
FIG. 15 illustrates a cross sectional view of the semiconductor device shown in FIG. 14 after an anisotropic etching process is applied to the bottom portion of the oxide layer in accordance with an embodiment.

FIG. 15 illustrates a cross sectional view of the semiconductor device shown in FIG. 14 after an anisotropic etching process is applied to the bottom portion of the oxide layer in accordance with an embodiment. An etching process, such as a reactive ion etch (RIE) or other dry etch, an anisotropic wet etch, or any other suitable anisotropic etch or patterning process, is performed to remove the bottom portion of the second gate dielectric layer 1402. As a result, the middle portion of the top surface of the n+ region 124 is free from oxide.

Figure 16:
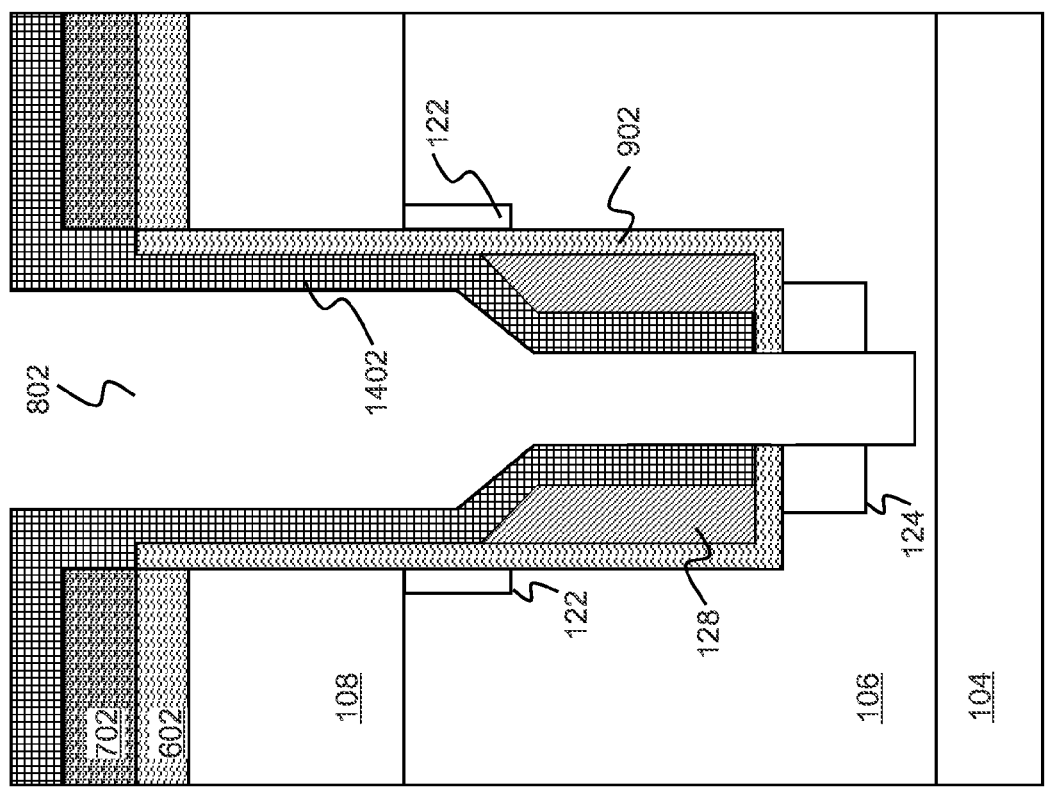
FIG. 16 illustrates a cross sectional view of the semiconductor device shown in FIG. 15 after a second trench is formed in accordance with an embodiment.

FIG. 16 illustrates a cross sectional view of the semiconductor device shown in FIG. 15 after a second trench is formed in accordance with an embodiment. Similar to the formation of the first trench shown in FIG. 8, an etching process, such as a reactive ion etch (RIE) or other dry etch, an anisotropic wet etch, or any other suitable anisotropic etch or patterning process, is applied to the top surface of the n+ region 124. As a result, a second trench 1602 is formed. As shown in FIG. 16, the etching process may etch through the n+ region 124 and partially etch the p-type epitaxial layer 106 to form the second trench 1602.

Figure 17:
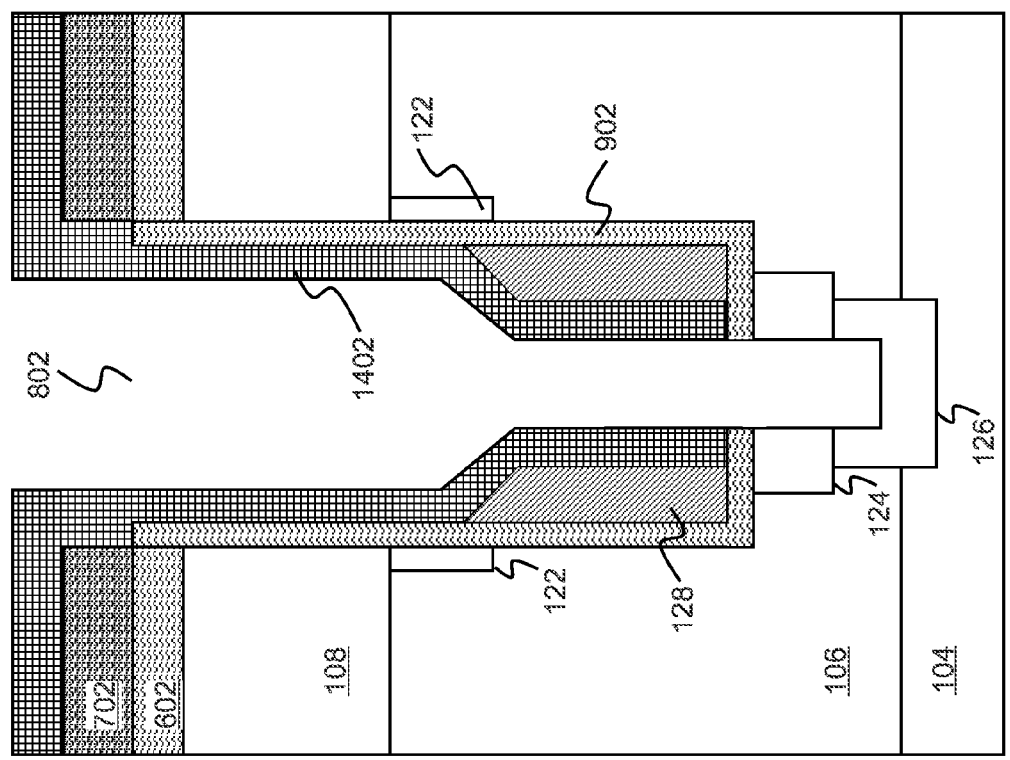
FIG. 17 illustrates a cross sectional view of the semiconductor device shown in FIG. 16 after a p+ region is formed in accordance with an embodiment.

FIG. 17 illustrates a cross sectional view of the semiconductor device shown in FIG. 16 after a p+ region is formed in accordance with an embodiment. The p+ region 126 is formed adjacent to the n+ region 124. The p+ region 126 may be formed by implanting a p-type dopant such as boron at a concentration of between about $10^{19}/cm^3$ and about $10^{21}/cm^3$. As shown in FIG. 17, the bottom portion of the second trench 1602 is surrounded by the p+ region 126.

Figure 18:
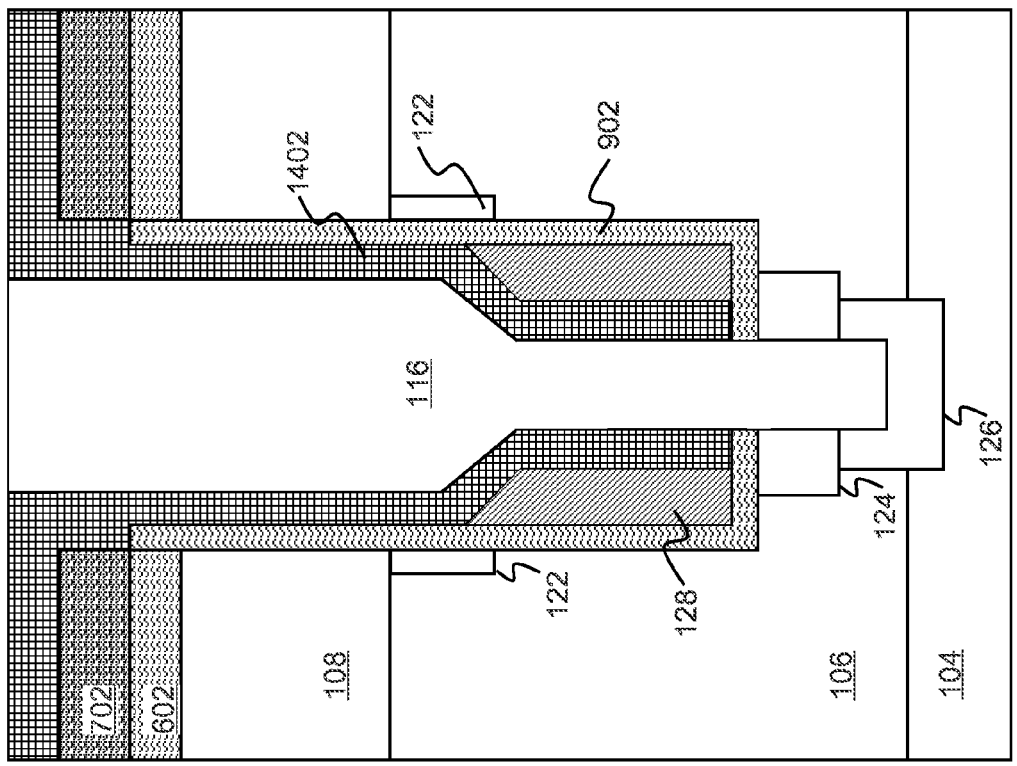
FIG. 18 illustrates a cross sectional view of the semiconductor device shown in FIG. 17 after a field plate is formed in the trench in accordance with an embodiment.

FIG. 18 illustrates a cross sectional view of the semiconductor device shown in FIG. 17 after a field plate is formed in the trench in accordance with an embodiment. The field plate 116 may be formed of conductive materials tantalum, titanium, molybdenum, tungsten, platinum, aluminum, hafnium, ruthenium or a combination thereof. In accordance with an embodiment, the field plate 116 is formed of tungsten. The field plate 116 may be formed by depositing tungsten by suitable fabrication techniques such as low-pressure chemical vapor deposition (LPCVD).

Figure 19:
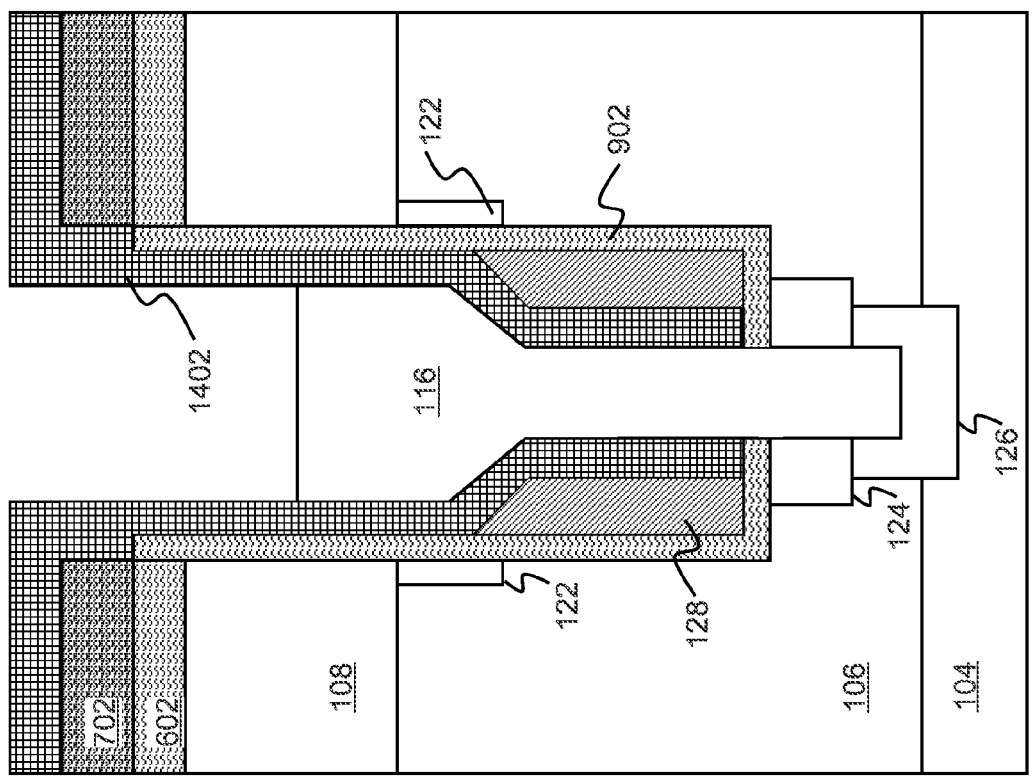
FIG. 19 illustrates a cross sectional view of the semiconductor device shown in FIG. 18 after an etch-back process is applied to the field plate in accordance with an embodiment.

FIG. 19 illustrates a cross sectional view of the semiconductor device shown in FIG. 18 after an etch-back process is applied to the field plate in accordance with an embodiment. An etch-back process is applied to the top of the field plate 116. As a result, a portion of the field plate 116 is removed. In accordance with an embodiment, the breakdown voltage of the bottom-source trench power MOSFET 100 shown in FIG. 1 is related to the height of the field plate 116. As such, the etch-back process is controlled so that the height of the field plate 116 can meet the breakdown voltage requirement of the bottom-source trench power MOSFET 100.

Figure 20:
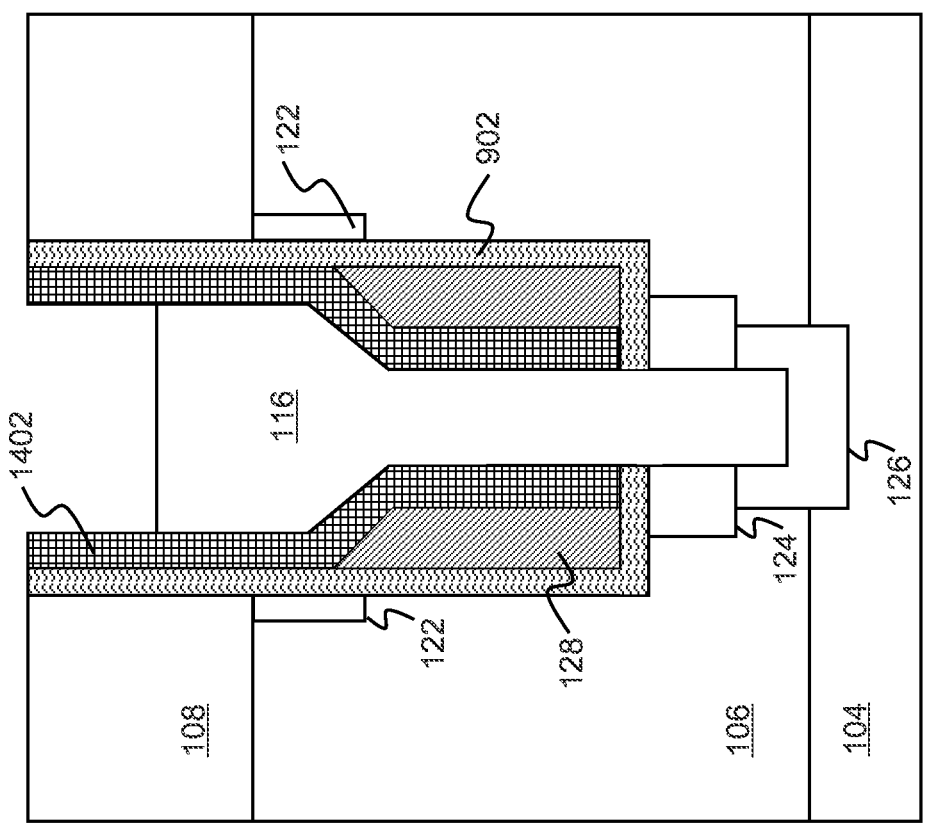
FIG. 20 illustrates a cross sectional view of the semiconductor device shown in FIG. 19 after a hard mask removal process is applied to the top surface of the semiconductor device in accordance with an embodiment.

FIG. 20 illustrates a cross sectional view of the semiconductor device shown in FIG. 19 after a hard mask removal process is applied to the top surface of the semiconductor device in accordance with an embodiment. As shown in FIG. 20, the hard mask layer and the oxide layers shown in FIG. 19 have been removed through a suitable hard mask layer removal process such as a wet etch process. The removal process is applied to the top surface of the semiconductor device until the n-type epitaxial layer 108 is exposed.

Figure 21:
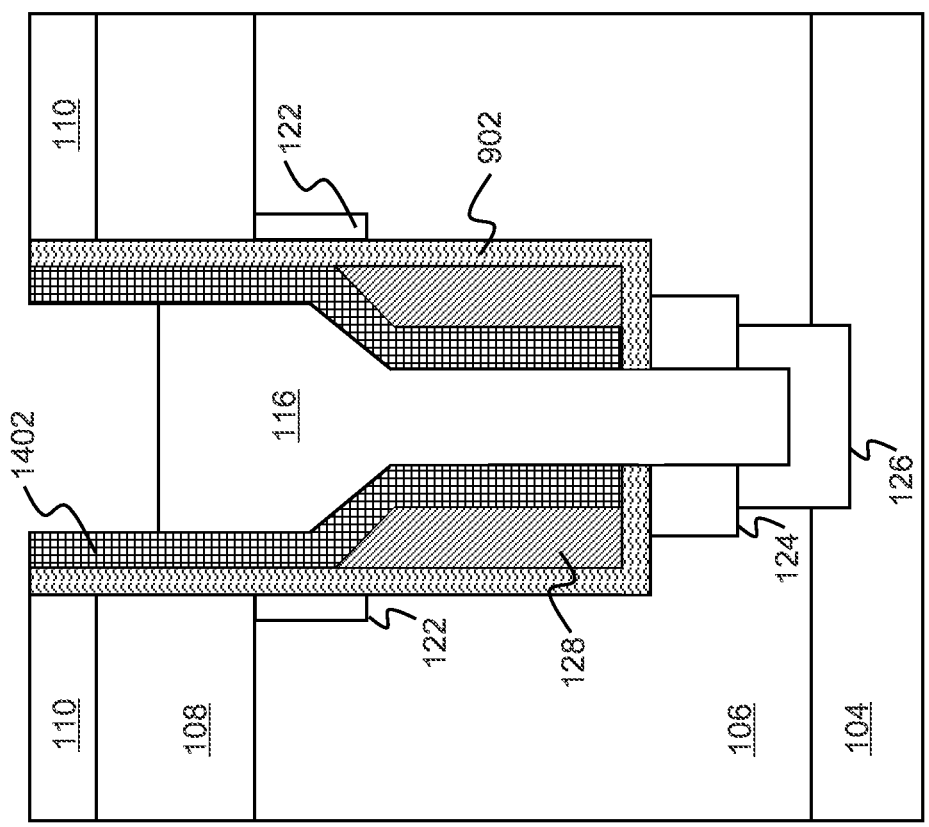
FIG. 21 illustrates a cross sectional view of the semiconductor device shown in FIG. 20 after an n+ region is formed in the n-type epitaxial layer in accordance with an embodiment.

FIG. 21 illustrates a cross sectional view of the semiconductor device shown in FIG. 20 after an n+ region is formed in the n-type epitaxial layer in accordance with an embodiment. As shown in FIG. 21, the n+ region 110 is formed through an ion implantation process. The n+ region 110 functions as a drain region of the bottom-source trench power MOSFET shown in FIG. 1. It should be noted that the drain of the bottom-source trench power MOSFET may include the n+ region 110, the n-type epitaxial layer 108 and the NDD regions 122.

In an embodiment in which the substrate 104 is a p-type substrate, the drain region 110 may be formed by implanting appropriate n-type dopants such as phosphorous, arsenic, or the like. Alternatively, in an embodiment in which the substrate 104 is an n-type substrate, the drain region 110 may be formed by implanting appropriate p-type dopants such as boron, gallium, indium, or the like. In accordance with an embodiment, the drain region 110 is of a doping density in a range from about $10^{19}/cm^3$ to about $10^{21}/cm^3$.

Figure 22:
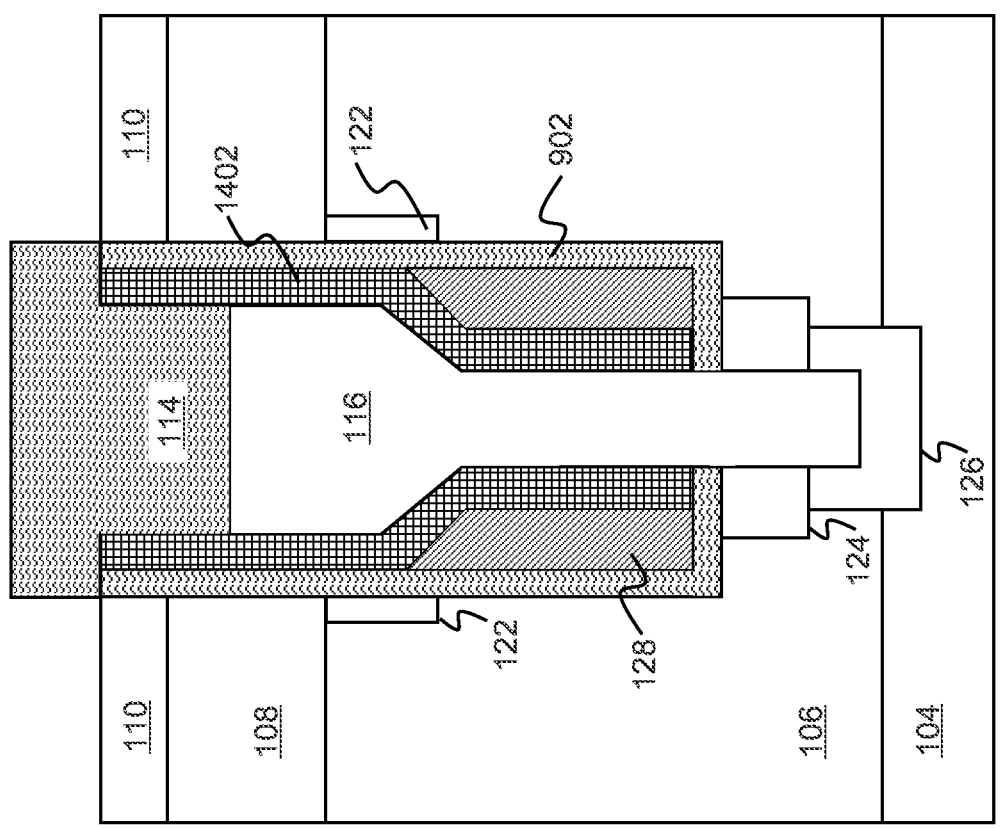
FIG. 22 illustrates a cross sectional view of the semiconductor device shown in FIG. 21 after a dielectric region is formed in the trench in accordance with an embodiment.

FIG. 22 illustrates a cross sectional view of the semiconductor device shown in FIG. 21 after a dielectric region is formed in the trench in accordance with an embodiment. The dielectric region 114 may be formed of an oxide such as silicon oxide. In accordance with an embodiment, the trench is filled with an oxide until the top surface of the oxide is higher than the top surface of the n+ region 110.

As shown in FIG. 22, the field plate 116 is separated from active regions (e.g., the NDD regions 122 and the n-type epitaxial layer 108) by the dielectric region 114. Likewise, the field plate 116 is insulated from the gate electrodes 128. In accordance with an embodiment, the separation between the field plate 116 and the gate electrode 128 is in a range from about 0.1 um to about 0.5 um.

Figure 23:
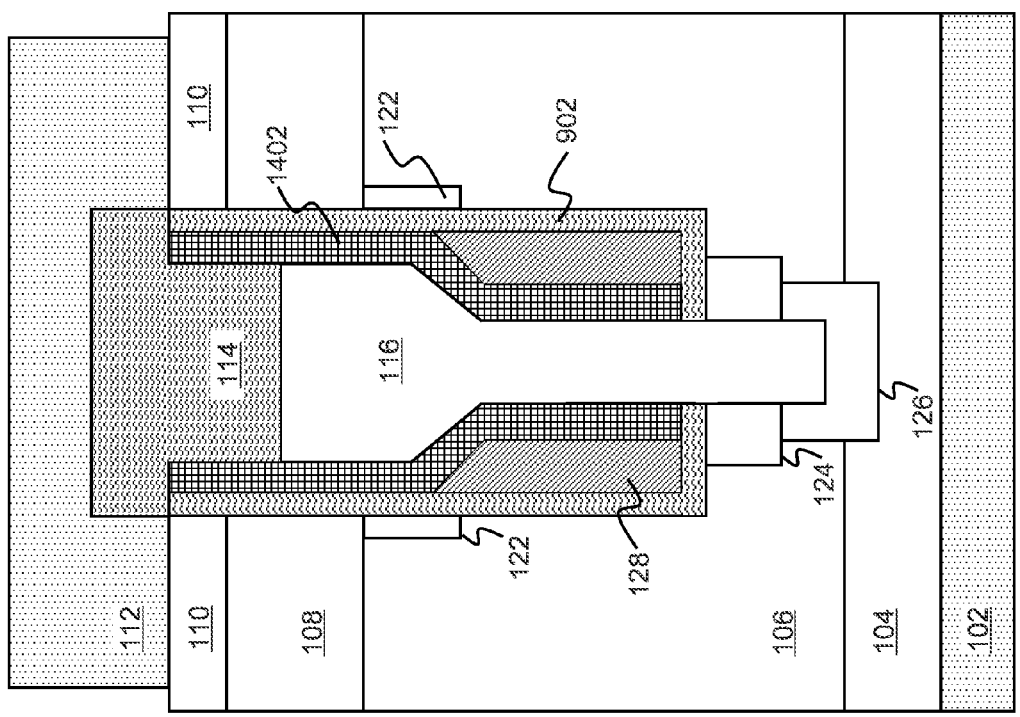
FIG. 23 illustrates a cross sectional view of the semiconductor device shown in FIG. 22 after drain and source contact plugs are formed in accordance with an embodiment.

FIG. 23 illustrates a cross sectional view of the semiconductor device shown in FIG. 22 after drain and source contact plugs are formed in accordance with an embodiment. The drain contact plug 112 and the source contact plug 102 may be formed of conductive materials. The drain contact plug 112 and the source contact plug 102 may be formed through suitable fabrication processes such as a damascene process.

As shown in FIG. 23, the drain contact plug 112 and the source contact plug 102 are formed on opposite sides of the p-type substrate 104. The trench comprising the gate electrodes 128 and the field plate 116 are formed between the drain contact plug 112 and the source contact plug 102. Moreover, the field plate 116 is electronically coupled to the source contact plug 102 through the p+ region 126 and the p-type substrate 104. It should be noted in FIG. 23 the source region is the N+ region 124. The field plate 116, the P+ region 126 and the P+ substrate 104 form a low resistance current path between the source region (N+ region 124) and the source contact plug 102.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a first epitaxial layer over a first side of a substrate;
a second epitaxial layer over the first epitaxial layer;
a first drain/source contact plug formed over the second epitaxial layer, wherein the first drain/source contact plug is coupled to a first drain/source region, and wherein the first drain/source region is between the first drain/source contact plug and the second epitaxial layer;
a second drain/source contact plug formed below a second side of the substrate, wherein the second drain/source contact plug is coupled to a second drain/source region, and wherein the first side is opposite to the second side;
a trench formed in the first drain/source region, the second epitaxial layer and the first epitaxial layer, and extending from a top surface of the first drain/source region to a bottom portion of the first epitaxial layer, wherein a bottom surface of the trench is in direct contact with a top surface of the second drain/source region;
a gate electrode in a lower portion of the trench; and
a field plate surrounded by the gate electrode, wherein the field plate is electrically coupled to the second drain/source region, and wherein the second drain/source region is connected to the second drain/source contact plug through a low resistance path including the field plate.

2. The apparatus of claim 1, further comprising:
a drain drift region formed along sidewalls of a middle portion of the trench, wherein the trench is surrounded by the drain drift region.

3. The apparatus of claim 1, wherein:
the first epitaxial layer is a p-type epitaxial layer formed over the substrate, and wherein a bottom surface of the p-type epitaxial layer is in direct contact with a top surface of the substrate; and
a portion of a p+ region formed in the p-type epitaxial layer, wherein the p+ region is electrically coupled to the field plate, wherein a doping density of the p+ region is different from a doping density of the p-type epitaxial layer.

4. The apparatus of claim 3, wherein:
the second drain/source region is an n+ region formed between the gate electrode and the p+ region.

5. The apparatus of claim 4, wherein the n+ region is coupled to the second drain/source contact plug through the field plate, the p+ region and the substrate.

6. The apparatus of claim 1, further comprising:
a dielectric film formed between the gate electrode and the field plate.

7. The apparatus of claim 6, wherein:
the dielectric film is formed of an oxide and have a thickness in a range from about 0.1 um to about 0.5 um.

8. The apparatus of claim 1, wherein:
the first drain/source region is a drain of a trench power transistor; and
the second drain/source region is a source of the trench power transistor.

9. A device comprising:
a drain region formed over a substrate;
a source region formed over the substrate, wherein a bottom surface of the drain region is higher than a top surface of the source region; and
a trench formed in the drain region and epitaxial layers between the drain region and the substrate, and extending from the drain region to the source region;
a gate electrode in the trench; and
a field plate formed adjacent to the gate electrode, wherein the gate electrode and the field plate are separated by a dielectric film, and wherein the field plate is electrically coupled to and in direct contact with the source region.

10. The device of claim 9, further comprising:
a drain-drift region coupled to the drain region, wherein the trench is surrounded by the drain drift region.

11. The device of claim 9, further comprising:
a first epitaxial layer formed over the substrate, wherein a bottom surface of the first epitaxial layer is in direct contact with a top surface of the substrate; and
a second epitaxial layer formed over the first epitaxial layer, wherein a conductivity type of the second epitaxial layer is different from a conductivity type of the first epitaxial layer.

12. The device of claim 9, further comprising:
a drain contact plug coupled to the drain region, wherein the drain contact plug is formed over a first side of the substrate; and
a source contact plug coupled to the source region, wherein the source contact plug is formed over a second side of the substrate, wherein the second side is opposite to the first side.

13. A structure comprising:
a first epitaxial layer on a substrate;
a source region in the first epitaxial layer;
a second epitaxial layer on the first epitaxial layer;
a drain region in the second epitaxial layer over;
a trench formed in the drain region, the second epitaxial layer and the first epitaxial layer, and extending from the drain region to a bottom portion of the first epitaxial layer;
a gate electrode in the trench; and
a field plate adjacent to the gate electrode, wherein the gate electrode and the field plate are separated by a dielectric film, and wherein the field plate is electrically coupled to and in direct contact with the source region.

14. The structure of claim 13, further comprising:
a source contact plug underlying the substrate; and
a drain contact plug overlying the drain region.

15. The structure of claim 13, wherein:
the substrate is of a first conductivity type;
the first epitaxial layer is of the first conductivity type; and
the second epitaxial layer is of a second conductivity type.

16. The structure of claim 13, wherein:
the substrate is of a first conductivity type;
the source region is of a second conductivity type; and
the drain region is of the second conductivity type.

17. The structure of claim 13, further comprising:
a drain-drift region coupled to the drain region.

* * * * *